United States Patent [19]

Mario et al.

[11] Patent Number: 4,562,093
[45] Date of Patent: Dec. 31, 1985

[54] PROCESS FOR THE PRODUCTION OF GLASS PANES HAVING A GLARE PROTECTION FILTER AND APPARATUS FOR CARRYING OUT THE PROCESS

[75] Inventors: Roth Mario, Aachen; Termath Günther, Gelsenkirchen, both of Fed. Rep. of Germany

[73] Assignee: Saint-Gobain Vitrage, Aubervilliers, France

[21] Appl. No.: 666,030

[22] Filed: Oct. 29, 1984

[30] Foreign Application Priority Data

Oct. 29, 1983 [DE] Fed. Rep. of Germany ....... 3339334
Jan. 12, 1984 [DE] Fed. Rep. of Germany ....... 3400843

[51] Int. Cl.⁴ .................. C23C 14/00; B05D 5/12; B05D 5/06; B05B 5/00
[52] U.S. Cl. .................. 427/109; 204/192 C; 204/192 R; 204/298; 427/160; 427/163; 427/166
[58] Field of Search .............. 427/109, 160, 163, 166; 204/192 R, 192 C, 298

[56] References Cited

U.S. PATENT DOCUMENTS 3,078,693 2/1963 Lytle ................... 427/163 X

Primary Examiner—James R. Hoffman
Attorney, Agent, or Firm—Pennie & Edmonds

[57] ABSTRACT

A process and apparatus for forming a glass pane having an upper filter band, and possibly both an upper and lower filter band. The glass pane may comprise a lamina of a laminated safety glass for use as a windshield of a vehicle.

In the process filter strips are applied to a glass sheet as the glass sheet is moved through a chamber. The filter strips are applied as a family of filter strips which extend continuously along the glass sheet in the direction of its movement. The filter strips of the family are spaced apart laterally. Each filter strip may extend along a straight path, or the filter strips may be of repeating arcuate outline or of sineshaped outline, for example. The filter strips between a pair of marginal filter strips are of a width that may be greater than the width of the marginal strips, and the filter strips may vary in width along their continuous length. The process envisions subdividing the glass sheet into a multiplicity of blanks, each of which includes a part of one or two adjacent filter strips, and cutting a glass pane from the blank.

25 Claims, 14 Drawing Figures

PROCESS FOR THE PRODUCTION OF GLASS PANES HAVING A GLARE PROTECTION FILTER AND APPARATUS FOR CARRYING OUT THE PROCESS

DESCRIPTION

1. Technical Field

The invention is in a process for the production of glass panes having a band filter along one edge, which typically may be the upper marginal edge of a glass pane for vehicles, or along both the upper and lower marginal edges of the glass pane. The band filter functions to impart to the glass pane the characteristics of increased absorption and/or reflection in the visible range of the spectrum The process may be a chemical (pyrolytic) process, or a thermal evaporation process, or a cathode atomization process. The invention also is in the apparatus for carrying out the process.

2. Background Art

Glass panes for vehicles having a band of filter providing a glare protection filter along the upper marginal edge are known. Typically, when the glass pane is a laminated glass of conventional type including a thermoplastic synthetic foil between two individual glass panes, the thermoplastic interlayer is dyed or printed with a suitable layer of color. These band filters function satisfactorily in the protection against glare in the visible range of the spectrum. The band filters, however, fail to impart to the glass pane a sufficient degree of reflection in the infrared range.

It is also known in the prior art that a band filter may be applied along the upper marginal edge of the glass pane itself. Many and diverse processes have been followed in applying the band filter to the glass pane. For example, the band filter may be applied in a vacuum according to the process of thermal vapor deposition, and the band filter may be applied according to the cathode atomization process These band filters, applied to the surface of the glass pane, have imparted satisfactory absorption and reflection characteristics to the glass pane, even in the infrared range.

According to a known prior art production technique, when the band filter is applied in a vacuum, the glass panes forming the outer layers of the glass laminate are first cut to their final dimension and, then, the band filter is applied to one of the glass panes. Following a bending process, the interlayer of the thermoplastic material is used to interconnect the glass panes. This production technique is not particularly economical in that the steps of individual treatment of each individual glass pane in the coating installation adds to the overall expense of operation.

SUMMARY OF THE INVENTION

The invention is directed to a process and apparatus for the economic production of a glass pane having an upper filter band and possibly both an upper and lower filter band. According to a preferred form of the invention, a sheet of glass which may be formed in a float glass manufacturing process is conveyed horizontally through a chamber of a continuous sweep-cathode atomization installation and a family of filter strips, continuous in one direction, are applied to a surface of the glass sheet during movement. The filter strips of the family of filter strips are continuous in one direction and spaced apart laterally of the direction of continuity. The filter strips between the marginal edges of the glass sheet and the filter strips along those edges may be of the same or different width along their continuous length, and they may be of substantially the same width as the filter strips along the marginal edges. The glass sheet may be subdivided along its length and width, and a glass pane may be cut from each subdivided glass sheet comprising a blank.

According to one aspect of the invention the filter strips are spaced apart and of a predetermined width so that segments of the glass sheet when subdivided along a lengthwise cut include a portion of two laterally spaced filter strips. These portions of the two laterally spaced filter strips ultimately constitute an upper and lower band filter along the glass pane.

According to this aspect, the process provides that the continuous filter strips between the marginal filter strips are of a predetermined width which may be about twice the width of the marginal filter strips, and at least about twice the width of a final filter band on the glass pane. Thus, when the sheet of glass is subdivided along its length, the line of subdivision being within the width of a filter strip, the portions of the filter strip which remain with each of the subdivided segments constitute the band filters for an individual glass pane.

According to another aspect of the invention, the filter strips across the sheet of glass may be of the same or substantially the same width and spaced apart so that the segments of the glass sheet when subdivided along a lengthwise cut include only a single filter strip. According to these aspects of the invention, the glass pane which ultimately is cut from a blank will include both an upper and lower filter band or only an upper filter band.

The invention envisions a family of filter strips which extend along a straight path as well as filter strips along the glass sheet having the form of repeating arc-shaped sections, or the form of a sineshaped pattern. Other forms of filter strips as may be envisioned for forming a filter band may be employed, as well.

Since, as a rule, a glass pane serving as a windshield for a vehicle has a curved upper and lower marginal edge it may be appropriate to provide a band filter that extends across the upper marginal region of the glass pane, and possibly the lower marginal region, as well, which has an edge, at the transition between the band filter and viewing area of the glass pane, extending parallel to the marginal edge of the glass pane. The forms of continuous filter strips having repeating arc-shaped sections, and filter strips in the form of a continuous sineshaped pattern may be used to form on a glass pane an upper filter band or both and upper and lower filter band having a limiting edge at the transition between the band filter and viewing area which follows the marginal edges of the glass pane.

However, it may be desired that the filter band have a limiting edge at the transition with the viewing area that does not extend parallel to the marginal edges of the glass pane. The limiting line of such a band filter, of a lower filter band, will extend toward the marginal edge of the glass pane, or drop off downward toward the sides, thereby increasing the viewing area of the glass pane in the lower marginal areas. The upper filter band will follow a similar course. While filter bands having this form may not be as aesthetically pleasing as a band filter whose transition edge is parallel to a marginal edge of the glass pane, the increased viewing area at the bottom of the glass pane and possibly better view of the sides of the road may be an important consideration in the manufacture of the glass pane.

The invention, thus, provides for the manufacture of a glass pane having an upper filter band with a transition line that extends parallel to the marginal edges of the glass pane and a lower filter band having a transition line that drops off downward toward the sides. The aesthetics, at least in an upper region where such a consideration is more apparent is preserved, and the need for possibly a better view of the side of the road is provided.

The apparatus for carrying out the process includes a continuous sputter installation including a chamber and a cathode providing a source of coating material which is deposited for condensation on a glass sheet moving below the cathode. In the several embodiments of the invention, the cathode may be fixed during deposition of the coating material, or it may be movable according to a predetermined, back and forth program of movement transverse to the direction of movement of the glass sheet. As such, a family of filter strips following a straight line path, and families of filter strips following a repeating arc-shaped or sineshaped path may be applied to the glass sheet. A shutter arrangement may be associated with the cathode thereby to adjust the width of any one or several of the filter strips. Movement of the cathode and the shutter permits the formation of filter strips having substantially any shape and outline in accordance with the pertinent shape of the glass pane.

According to other aspects of the invention, a layer of material, highly transparent in the visible spectrum, may be coated on the entire surface of the glass sheet during the process of coating the filter strips. The layer of material will have a high reflection in the long wave infrared spectrum region, and consequently a low emission capacity. Further, whenever the filter strips consist of electrically conductive layers it may be desirable to also include a complete surface coating of conductive material juxtaposed to the filter strips thereby to produce an electrically heatable glass pane. Such an electrically heated glass pane has been found to operate with a level of voltage considerably lower than known heatable glass panes for vehicles. To this end, the band filters have a lower electrical resistance and, therefore, act like electrodes or current feeding rails shifted toward the inside of the glass pane.

The process of the invention may be carried out on silicate glass sheets, and, in addition, on plates or sheets of any transparent, synthetic material capable of use as a pane for a vehicle. The synthetic sheet, if a plastic sheet, must be free of solvents and free of softness. Furthermore, it is possible, for example, to coat an adhesive foil used in the production of a laminated glass pane, which foil may consist of a thermoplastic synthetic material, rather than the silicate glass sheet. The proviso, however, is that the synthetic material fulfill the heretofore mentioned conditions. One suitable material is thermoplastic polyurethane.

The invention will be better understood as the description, to be read in conjunction with a view of the drawing, continues.

BEST MODE FOR CARRYING OUT THE INVENTION

The process for the production of a glass pane having a band filter along one marginal edge, preferably the upper edge, or along two marginal edges including both the upper and lower marginal edges, is carried out during movement of a glass sheet 1 horizontally through apparatus to be described. The glass sheet may be formed in a float glass furnace and may measure 6 m in length, and have a width of 3 m or more. The size of the glass sheet 1 permits the glass sheet to be subdivided into a plurality of smaller glass sheets 14 and finally, each of the glass sheets 14 may be cut to form a glass pane 8.

Figure 1:
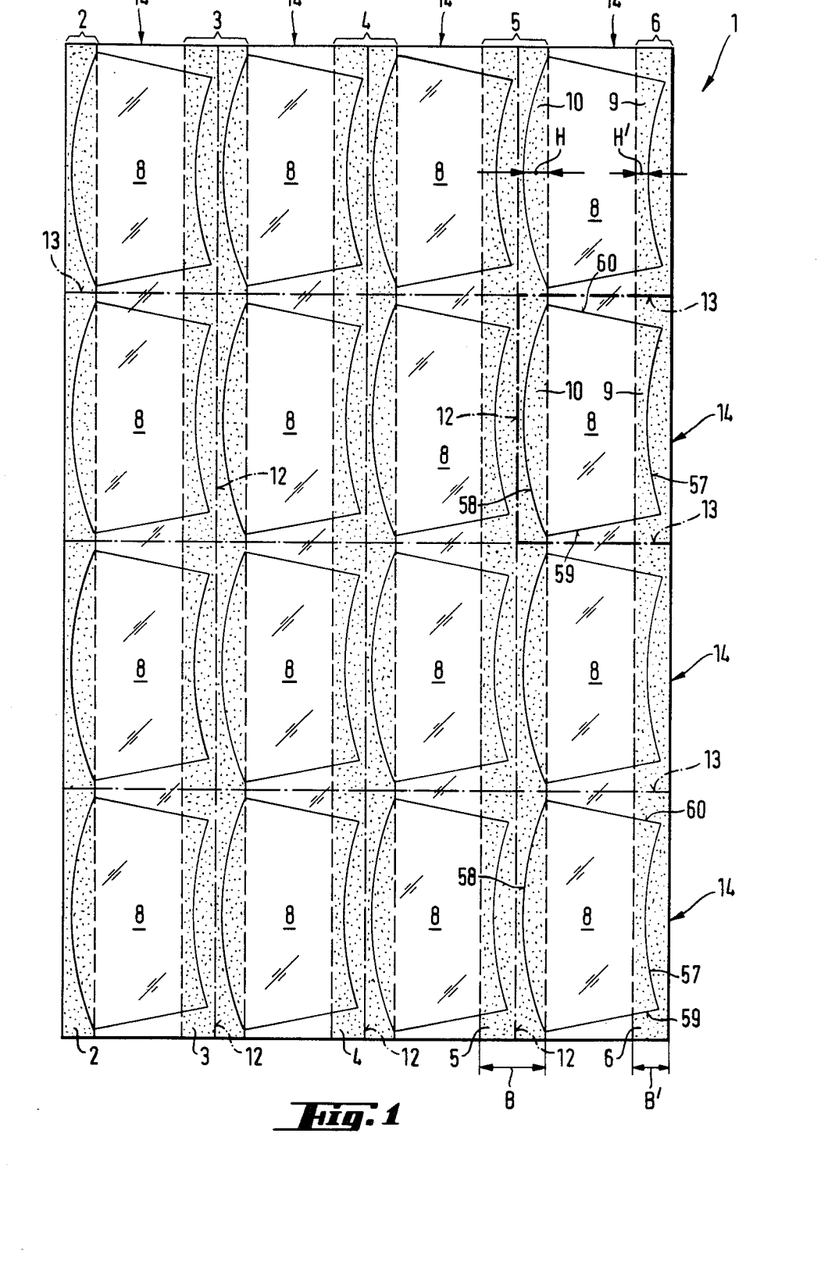
FIGS. 1–4 are plan views which illustrate a sheet of glass, divided into a plurality of subsheets from which a glass pane is derived, and a plurality of spaced, coated strips along the major dimension of the sheet.

According to the process of the invention, glass sheet 1 is subjected to a coating treatment which includes the application of a plurality of filter strips on one side of the glass sheet and along its length. With reference to FIG. 1, the filter strips include filter strips 2 and 6 located along the marginal edges of glass sheet 1 and filter strips 3, 4 and 5 located at equidistant spacing therebetween. Each of the filter strips extends along a linear path from one end of the glass sheet 1 to the other. Each of the filter strips 3, 4 and 5 are of a width B, and the filter strips 2 and 6 are of a width B'. The position of the filter strips 2, 3, . . . 6 on the glass sheet 1, that is, the width and mutual spacing of the filter strips on the glass sheet will depend upon the size of the individual glass panes 8 and the size of the subdivided glass sheets 14 from which they are cut. The glass panes 8 have the size and shape for use as a windshield for a vehicle. Moreover, the widths B and B' of the filter strips will depend upon the distances H and H' which represent, respectively, the maximum width of an upper band filter 9 and the minimum width of a lower band filter 10. The minimum and maximum width dimension are taken along a line which substantially bisects the glass pane 8. Thus, the width and mutual spacing of the filter strips 2, 3, . . . 6 will be dependent on the cited parameters and to adjust the conditions of the process in the application of the filter strips to glass sheet 1.

Figure 2:
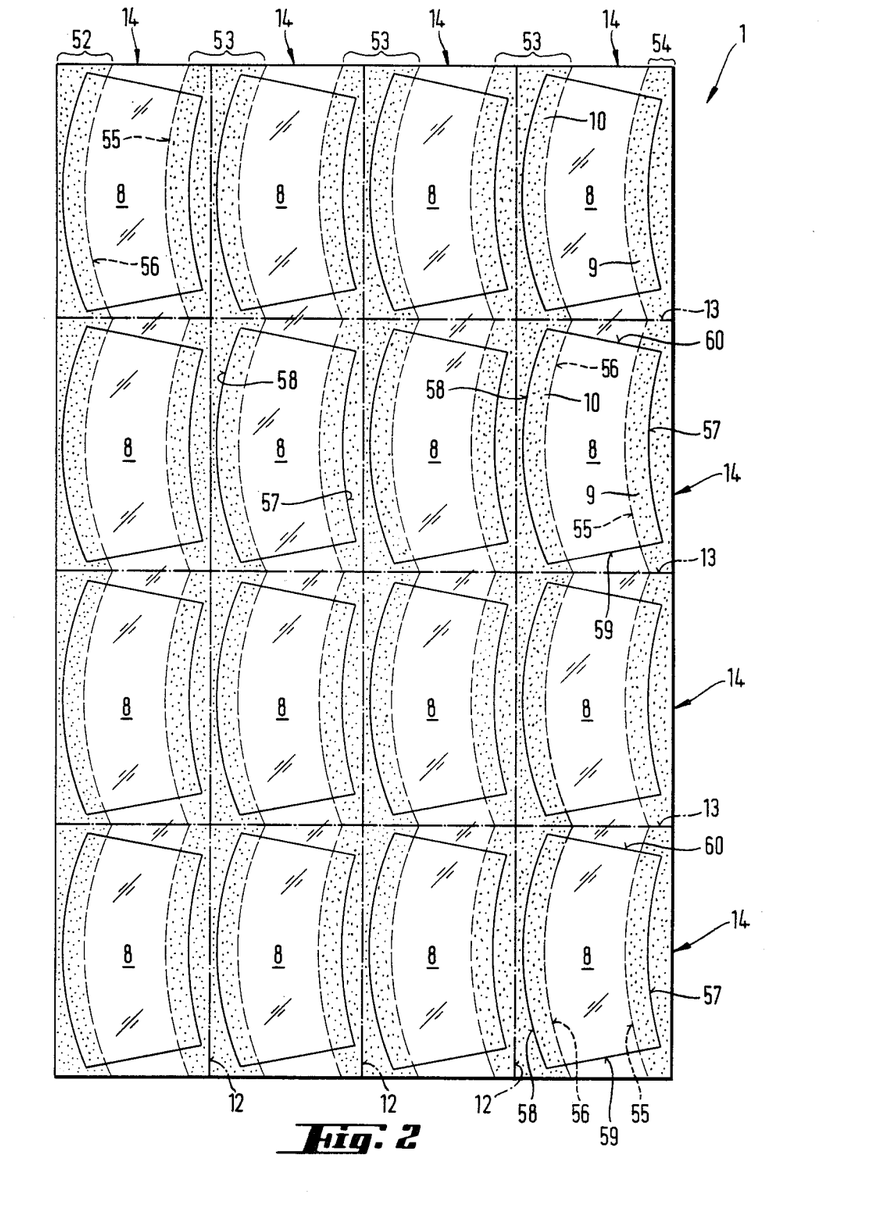
Figure 3:
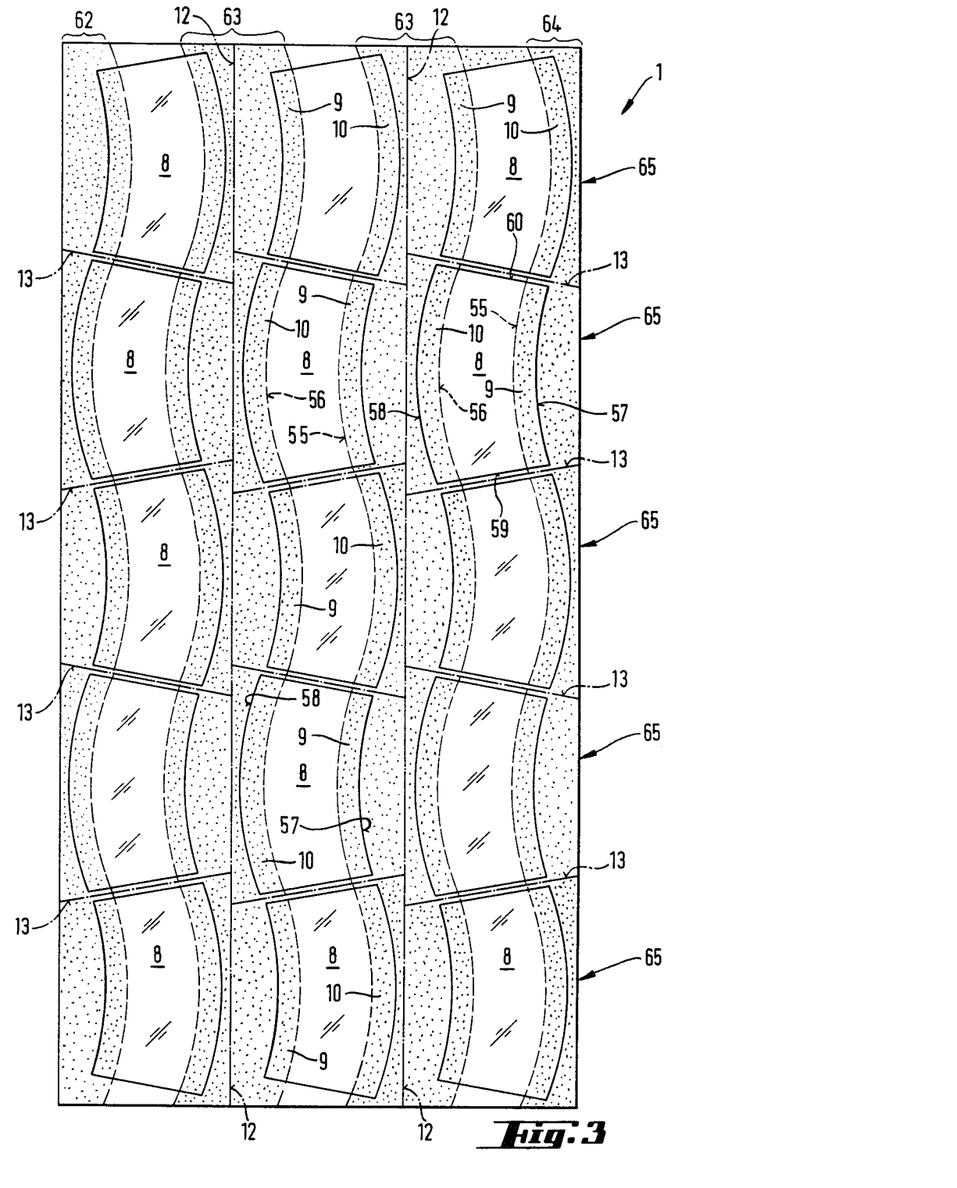
Figure 4:
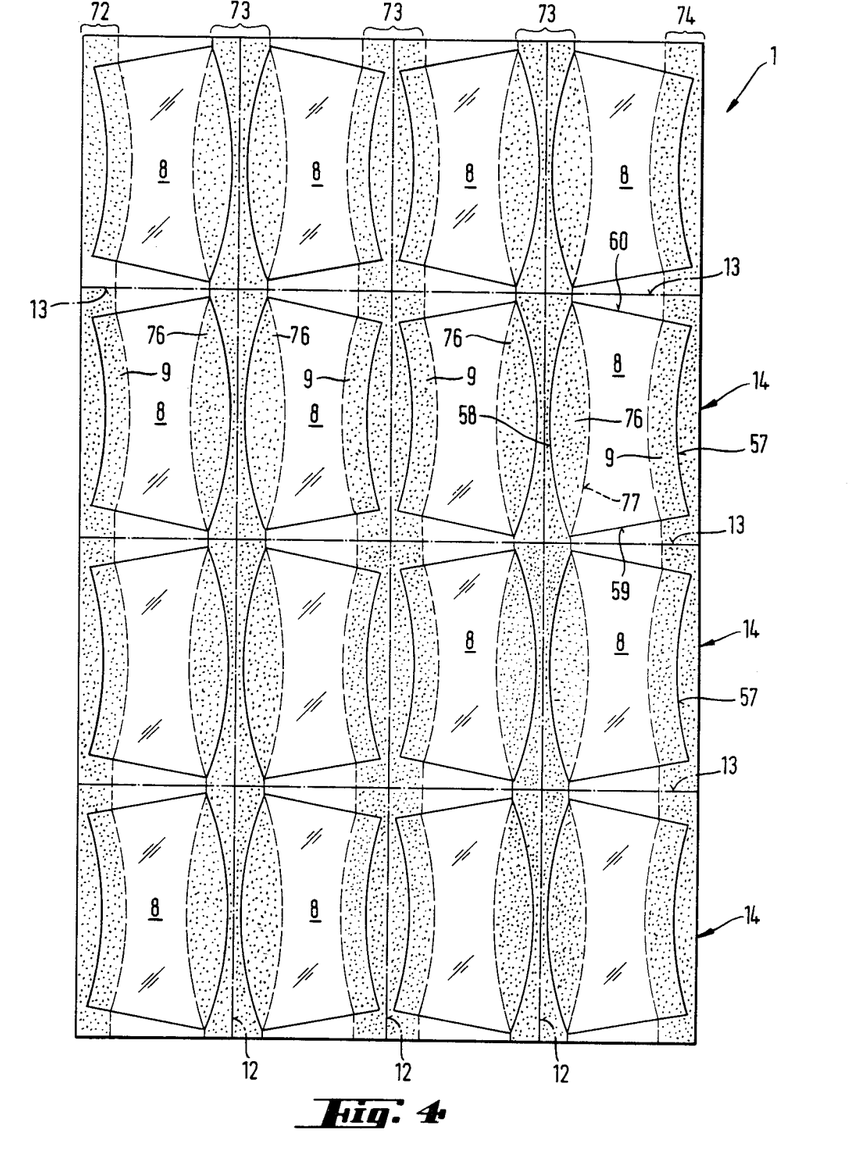

FIG. 1 and similarly FIGS. 2–4 of the drawing illustrate the application of filter strips to the glass sheet 1 in an arrangement of filter strips thereby to provide both an upper and lower filter band in glass pane 8. It is, however, equally feasible to apply the filter strips to glass sheet 1 in a manner which ultimately will provide the glass pane with a single filter band. In this case, the width of the filter strips between the outer filter strips along the marginal edges of glass sheet 1, such as filter strips 3, 4 and 5, are narrowed and located to those positions on the glass sheet determined by the position of the glass panes 8 on the glass sheet. In addition, in FIG. 1, the filter strip 2 is eliminated. Similar narrowing, relocation and elimination of filter strips will be carried out in the FIGS. 2–4 illustrations, as well.

The filter band or bands, as will be discussed, serve to impart to the glass pane 8 the desired reflection and absorption characteristics.

Turning to FIGS. 2–4, these Figures illustrate filter strips of somewhat modified outline which have been applied to the glass sheet 1. In FIG. 2, the filter strips 52 and 54 are located along the marginal edges of the glass sheet, and a plurality of filter strips 53 are located at equidistant spacing therebetween. The pattern followed by the filter strips is that of a repeating sineshaped curve. More particularly each sineshaped curve commences at an edge (the edge along the minor dimension) of the glass sheet 1 and repeats at each line 13 comprising a series of parallel lines that subdivide the glass sheet along its length. Each of the filter strips 53 have a constant width along their entire length. The curvature of the sineshaped filter strips is selected in a manner that the delimiting lines 55, 56 of the upper and lower filter bands 9, 10 adjacent the normal viewing space through the glass pane follow the corresponding edges 57, 58 of the glass pane 8. Particularly, the upper band 9, and the lower band 10, if there is a lower band, extend parallel to the edges 57, 58 of the glass pane. Thus, the filter bands preferably are of constant width therealong.

FIG. 3 illustrates a family of filter strips applied to glass sheet 1 along complete curves of sineshaped or similar outline. The filter strips include filter strips 62, 63 and 64 which are arranged in a manner whereby filter strips 62 and 64 are located along the marginal edges of glass sheet 1 and a plurality of filter strips 63 are located therebetween.

The glass sheet 1 of FIG. 3 generally duplicates the glass sheets of FIGS. 1 and 2, except that the subdivided glass sheets 65 are of trapezoidal rather than rectangular outline and the pattern of the glass panes 8 to be cut from individual subdivided glass sheets, that is, the flow of the edges 57, 58 of the glass panes follow substantially the curve of the filter strips. As seen in FIG. 3, the glass panes 8 located in side-by-side relation, along the major dimension of glass sheet 1, alternates so that an edge 58 of one glass pane flows along a sineshpe curve into an edge 57 of an adjacent glass pane. In other words, adjacent glass panes are turned 180° about an axis between their upper and lower edges.

Each of the filter strips 63 have a constant width along their entire length. Further, the delimiting lines 55, 56 of the upper and lower filter bands 9, 10 adjacent the normal viewing space through the glass pane follow the corresponding edges 57, 58 of the glass pane 8. Particularly, as in FIGS. 1 and 2, the upper and lower filter bands 9, 10 extend parallel to the edges 57, 58 and are of constant width therealong.

The glass sheet 1 of FIGS. 1 and 2, and FIG. 4, as will be seen, is subdivided into a plurality of rectangular glass sheets 14. The subdivision is along a family of parallel lines 12 (each extending along the major dimension of glass sheet 1) and a family of parallel lines 13 (each extending along the minor dimension) perpendicular thereto. A glass pane 8 is located in each subdivided glass sheet 14 within the circumferential lines 57, 58, 59 and 60 (see FIGS. 1, 2 and 4). In order to cut out an individual glass pane 8, in the form of the invention of FIGS. 1, 2 and 4, the glass sheet 1 may be broken or divided in the longitudinal direction (along the major dimension) along lines 12, and then each strip may be broken or divided along lines 13. The lines 12, 13 may be applied to glass sheet 1 at any time. The individual glass panes 8, then, are cut from individual subdivided glass sheets 14 which are created following the breaking operation.

Referring to FIG. 3, the glass sheet 1 is subdivided into the plurality of trapezoidal shaped glass sheets 65 by first applying to the glass sheet a plurality of lines 12 and breaking the glass sheet along the lines into a plurality of strips. Thereafter, lines 13 are applied to each strip and the strips are further subdivided into the individual trapezoidal glass sheets 65. These subdivided glass sheets, as the subdivided glass sheets 14, represent a blank for the glass panes 8 to be cut along the circumferential lines 57, 58, 59 and 60.

Turning to FIG. 4, this Figure illustrates a plurality of filter strips including filter strips 72, 73 and 74 extending along the major dimension of glass sheet 1. The filter strips 72 and 74 are located along the margins of the glass sheet and a plurality of filter strips 73 are located between the marginal filter strips. The filter strips 73 are located at equal spacing across the minor dimension of glass sheet 1. The filter strips are shaped in a manner that each glass pane 8 includes an upper filter band 9, a band which duplicates the upper filter band which is similarly numbered in FIGS. 2 and 3, and a lower filter band 76. The lower filter band tapers toward the lateral edges of glass pane 8 from a maximum width at about a plane which bisects the glass pane. Thus, as may be apparent, the limiting line 77 of the lower filter band does not follow the marginal edge of the glass pane thereby to follow generally a horizontal path when the glass pane is mounted as a windshield. The tapering of the filter band 76 toward the lateral edges of glass pane 8 may improve the capability of recognition of the lateral limitation of the road, and the greater width of the filter band at the location from which it tapers may act to considerably decrease the blinding effect of reflections of light rays from the hood of the vehicle. This aspect of the configuration of the lower filter band may be particularly effective during conditions of darkness. The variable development of the upper and lower filter bands 9, 76 will provide optimal glare protection characteristics.

The filter strips 2, 3, . . . 6 (FIG. 1), 52, 53 and 54 (FIG. 2), 62, 63 and 64 (FIG. 3), and 72, 73 and 74 (FIG. 4) may be applied according to several processes, such as a chemical process by pyrolytic deposition of metal compounds, especially metal-organic compounds. A chemical process of deposition may be carried out directly on a sheet of float glass, along a float glass line, before the glass sheet 1 is subdivided into the individual glass sheets 14 comprising the blank from which glass panes 8 are formed. The families of filter strips hereafter will be referred to as "filter strips".

Preferably, however, the filter strips are applied in a vacuum with the assist of the process of cathode atomization. The process and apparatus will be described below.

The filter strips are applied to the glass sheet 1 in a manner whereby the capability and the degree of absorption of each filter band in the glass pane 8 decreases from the marginal edge of the glass pane toward the viewing area. As a result, the continuous increase of the capability of transmission in the visible range, a continuously running transition toward the viewing area and main field of vision will be created so that the transition from the filter band to the main field of vision will not appear in a startling and disturbing manner.

Figure 5:
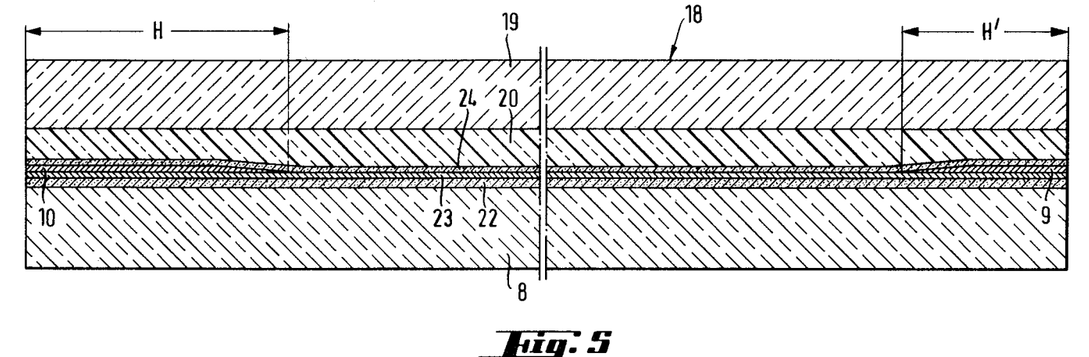
FIG. 5 is a view in section of a laminated glass pane including a pair of coated strips applied according to a process of the invention.

Referring to FIG. 5, each glass pane 8 may be processed to form a laminated glass pane 18. The laminated glass pane includes a glass pane 8 and a glass pane 19, comprising outer lamina, and a thermoplastic intermediate layer 20. The thermoplastic intermediate layer may be one of the conventional materials, such as polyvinyl butyral, and the lamina may be bonded together under the action of heat and pressure. The glass pane 8 is a pane having a coating at least including an upper filter band 9, and the glass pane 19 is an uncoated glass pane.

With continued reference to FIG. 5, glass pane 8 is illustrated as including an upper and lower filter band 9, 10 having a width dimension of H' and H, respectively. The section of FIG. 5 is along substantially a plane which bisects the glass pane of FIG. 1. Thus, the width of the lower filter band 10 is greater than the width of the upper filter band.

In FIG. 5, the upper and lower filter bands 9, 10 are juxtaposed to a layer 24 serving as a protective layer and a layer 23 which is a metal layer providing a capability of reflection of infrared rays. A further layer 22 resides between the glass pane 8 and the metal layer 23 for the purpose of adhesively bonding the metal layer to the glass pane. These several layers provide the laminated glass pane with particularly favorable characteristics.

The adhesive layer 22 consists preferably of a metal or semiconductor compound, such as tin oxide, indium tin oxide, titanium oxide, titanium nitride or zinc sulfide, and has a thickness of about 300 to 600 Å. The metal layer consists preferably of silver, aluminum, chromium, iron, gold, copper or mixtures or alloys of these and other similar metals. The metal layer has a thickness of about 100 to 250 Å. The upper and lower filter bands 9, 10 are disposed on the metal layer and protected by protective layer 24 which may consist of the same metal or semiconductor compounds as the adhesive layer 22. The upper and lower filter bands 9, 10 may consist of the same metals as metal layer 23. The thickness of the upper and lower filter bands is determined cooperatively with the thickness of the metal layer so that the desired absorption and glare protection characteristics are realized.

In use of the laminated glass pane 18 as a windshield of a vehicle, the glass pane is oriented so that the upper and lower filter bands 9, 10 are directed to the outside. In this manner the filter bands will provide optimal reflective capability. As previously stated, the width of band 10 is greater than the width of the upper filter band 9. As may also be seen in FIG. 5, and as previously suggested in the discussion of the transition between a filter band and the viewing area, the thickness of each filter band decreases in a cuneiform or wedge-shaped manner in the transition region toward the viewing area of the main field of vision. As a result, the filter bands permit continuously increasing transmission capability in the transition region. The cuneiform tapering of the filter strips and the band filters may be carried out with apparatus of the type illustrated in FIGS. 10 and 11.

The multiple layers 22, 23 and 24, together with the upper and lower band filters 9, 10 (or band filters 9 and 76) provide the laminated glass pane 18 with the advantage of being particularly suited for the electrical heating of the windshield of the vehicle. This result has been found to be the case when the upper and lower band filters and the metal layer 23 have relatively good electrical conductivity. In this situation the band filters act as electrodes displaced inwardly and operation may be carried out at a lower electrical voltage than is the case with a laminated glass pane having an electrically conductive coating.

Figure 6:
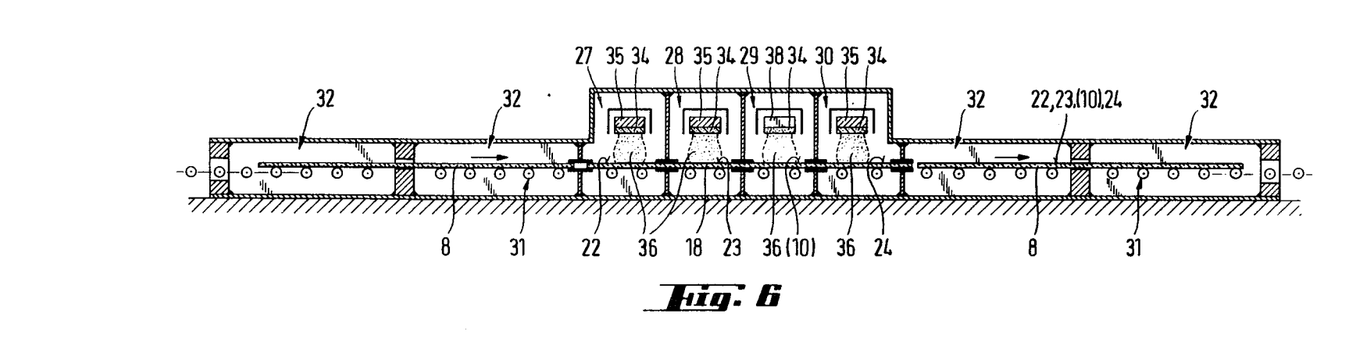
FIG. 6 is a vertical section along a multichamber installation of passage for carrying out a cathode atomization process according to the invention.
Figures 7, 8:
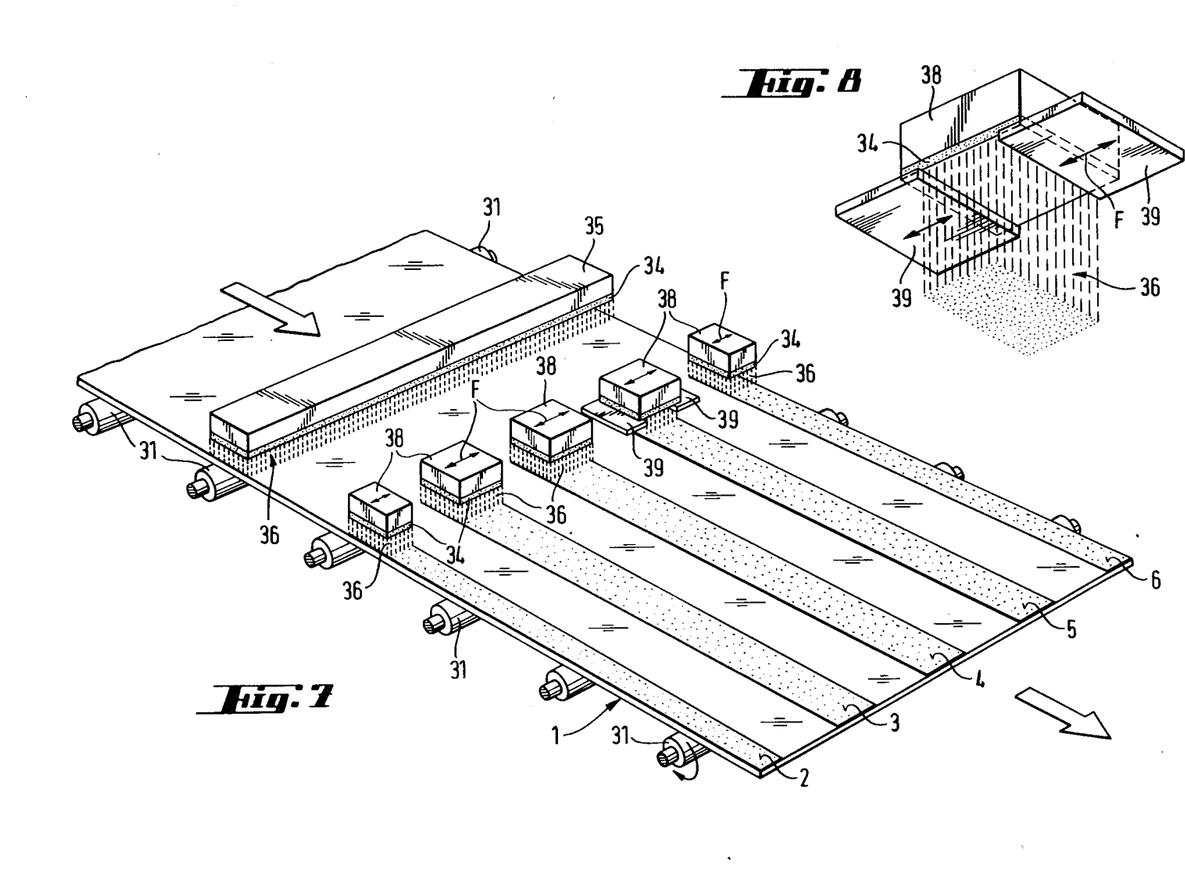
FIG. 7 is a perspective view which illustrates schematically an arrangement of a plurality of atomization cathodes in a coating chamber of the installation of passage of FIG. 6.
FIG. 8 is a perspective view, from the bottom, of an atomization cathode of slightly modified construction.
Figures 9, 10, 11:
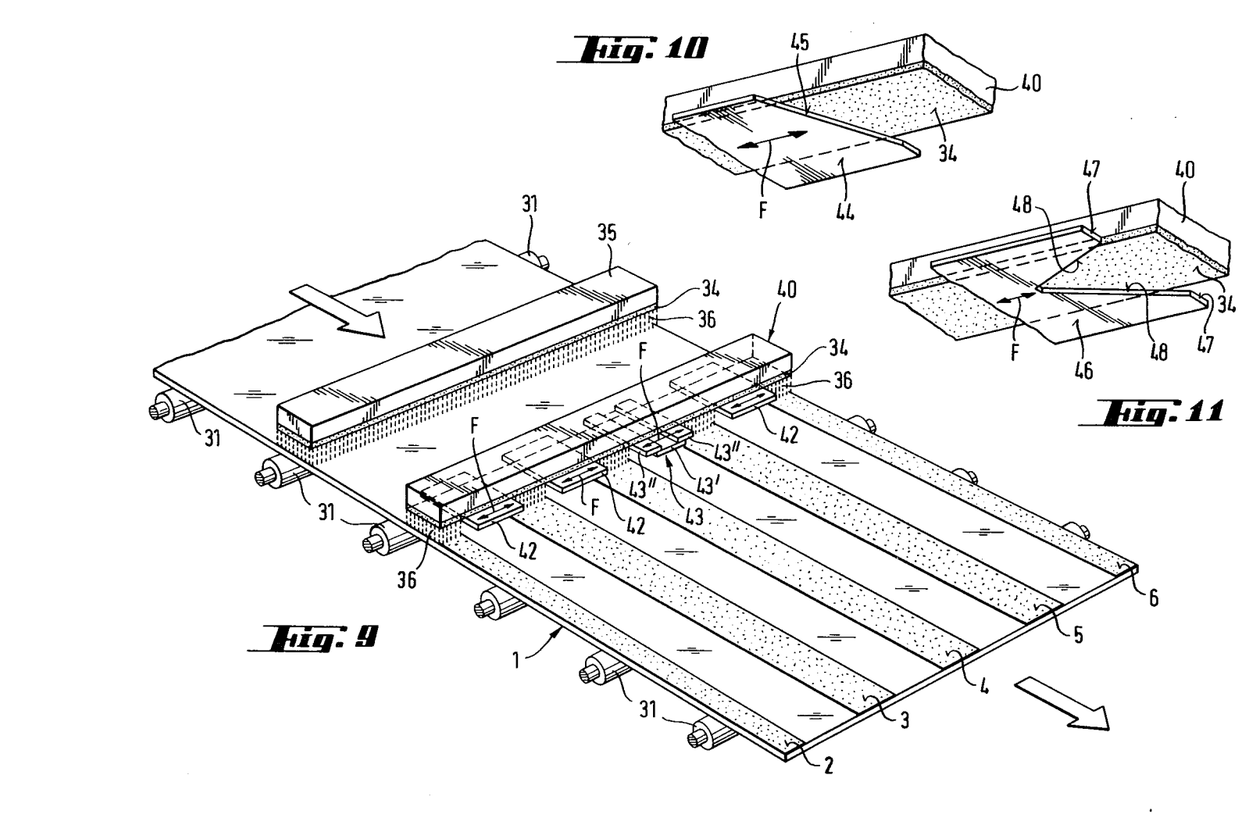
FIG. 9 is a view similar to FIG. 7 although illustrating a somewhat modified form of atomization cathode.
FIGS. 10 and 11 are perspective views, from the bottom, of an atomization cathode including a shutter below the cathode for forming a filter band having a continuously changing density.

Reference now may be had to the apparatus of a sweepcathode atomization installation which is illustrated schematically in FIG. 6 and other Figures of the drawing, for example, FIGS. 7, 9 and so forth. The sweep, high performance magnetron atomization installation includes a channel-like housing and several high vacuum coating chambers along a conveyor system formed by a plurality of rollers 31 which define a transportation path. The FIG. 6 installation includes four chambers 27, 28, 29 and 30 and a pair of sluice chambers 32 which are located along the transportation path. The sluice chambers precede and/or follow the several coating chambers.

According to the discussion of the laminated glass pane 18, the adhesive layer 22 may be applied to the glass sheet 1 within chamber 27, the metal layer 23 may be applied to the adhesive layer within chamber 28, the filter strips 2, 3, . . . 6 (or the families of fiter strips in FIGS. 2-4) may be applied to the metal layer within chamber 29, and the protective layer 24 may be applied to the filter strips and exposed metal layer within chamber 30.

The operation of application is carried out substantially similarly in each coating chamber. To this end, the coating chambers 27, 28 and 30 each include a sputter cathode 35 extending from one side of the chamber to the other (see FIGS. 7 and 9 for example). A plate 34, or so-called target, is attached to the lower surface of the cathode. The cathode and target combination are coextensive and they extend throughout a length of 3 m or more to at least equal the minor dimensional width of glass sheet 1. The material of the coating to be dusted is supplied to the cathode and target combination to move toward the surface to be coated in the form of material clouds 36 which condenses evenly and continuously, and forms a desired even layer. In contrast, the filter strips 2, 3, . . . 6 are formed by the implementation of a number of sputter cathodes 38 equal to the number of filter strips to be formed. A plate 34, or so-called target, is similarly mounted to each cathode and the material of the coating on the surface of the metal layer 23 is supplied and dusted in the manner heretofore discussed. The individual cathodes 38 are mounted to a support structure (not shown) for movement laterally of the path of movement of glass sheet 1. The movement may be in either direction as represented by the arrows F thereby to align the position of each cathode with respect to the glass sheet 1.

Different overall arrangements and forms of sputter cathodes, as illustrated in FIG. 9 and other Figures will be discussed as the description continues.

With continued reference to FIG. 4, and FIG. 5, it may be seen that structure is provided to adjust the width of a filter strip In this connection, a shutter or pair of shutters 39 may be supported below a plate 34. As illustrated, a pair of shutters are supported below the plate, and each shutter is movable in the directions of the arrows (the directions of movement of the shutters are the same as that of the cathode). The shutters may be mounted in any convenient manner for movement to occlude the terminal ends of the cathodes 38 or of the targets 34 in achieving desired criteria of width of the filter strips. Only a single pair of shutters is shown for reasons of simplifying the Figure.

In FIG. 9 there is illustrated a single cathode 40 for use in forming the filter strips 2, 3 . . . 6. The cathode 40, used in substitution for the cathodes 38, extends completely across the chamber 29 and has a length of 3 m or more, for use with a glass sheet having the dimension previously discussed. A plurality of shutters 42 are mounted below the cathode to occlude the terminal end of the cathode or the target 34. As illustrated in FIG. 9, the target is located on the cathode and is coextensive with the cathode across the width of chamber 29. Each shutter is mounted (the mounting is not shown) so that its position relative to glass sheet 1 is adjustable in the direction illustrated by the arrows F.

A multiple shutter 43 may also be mounted on the cathode 40 for purposes of adjustment of the width, in addition to the positioning of filter strips 2, 3, . . . 6 on the glass sheet 1. The shutter 43 includes a pane 43' and two panes 43" located in a lateral disposition from pane 43' which is a middle pane. The lateral panes may be mounted either above or below the middle pane and each lateral pane overlaps the middle pane. Both the middle pane and the lateral panes are movable in the directions of arrows F for the twofold adjustment.

During the discussion directed to FIG. 5, the cuneiform or wedge-shaped contour at the region of transition between the filter bands 9, 10 and the viewing area was referenced to. This region of transition between the filter strips 2, 3 . . . 6, and ultimately the filter band, and the viewing area of high transparency therebetween may be influenced by the formation of any one of the shutters heretofore described including shutters 39, 42 and 43.

Turning to FIG. 10, a shutter 44 is illustrated which also provides the action of influencing the transparency in the area of transition between the filter bands and the highly transparent viewing area therebetween. According to FIG. 10, the shutter 44 includes an edge 45 bevelled at an acute angle from a perpendicular to the direction of movement (arrow F) that may be taken by the shutter. Thus, the shutter functions to limit the effective surface of cathode 40, or of the target 34, which decreases continuously in the direction toward a completely occluded area. The shutter 46 (see FIG. 11) and both the limiting edge 47 and cuneiform recess 48 provide the same effect.

Figure 12:
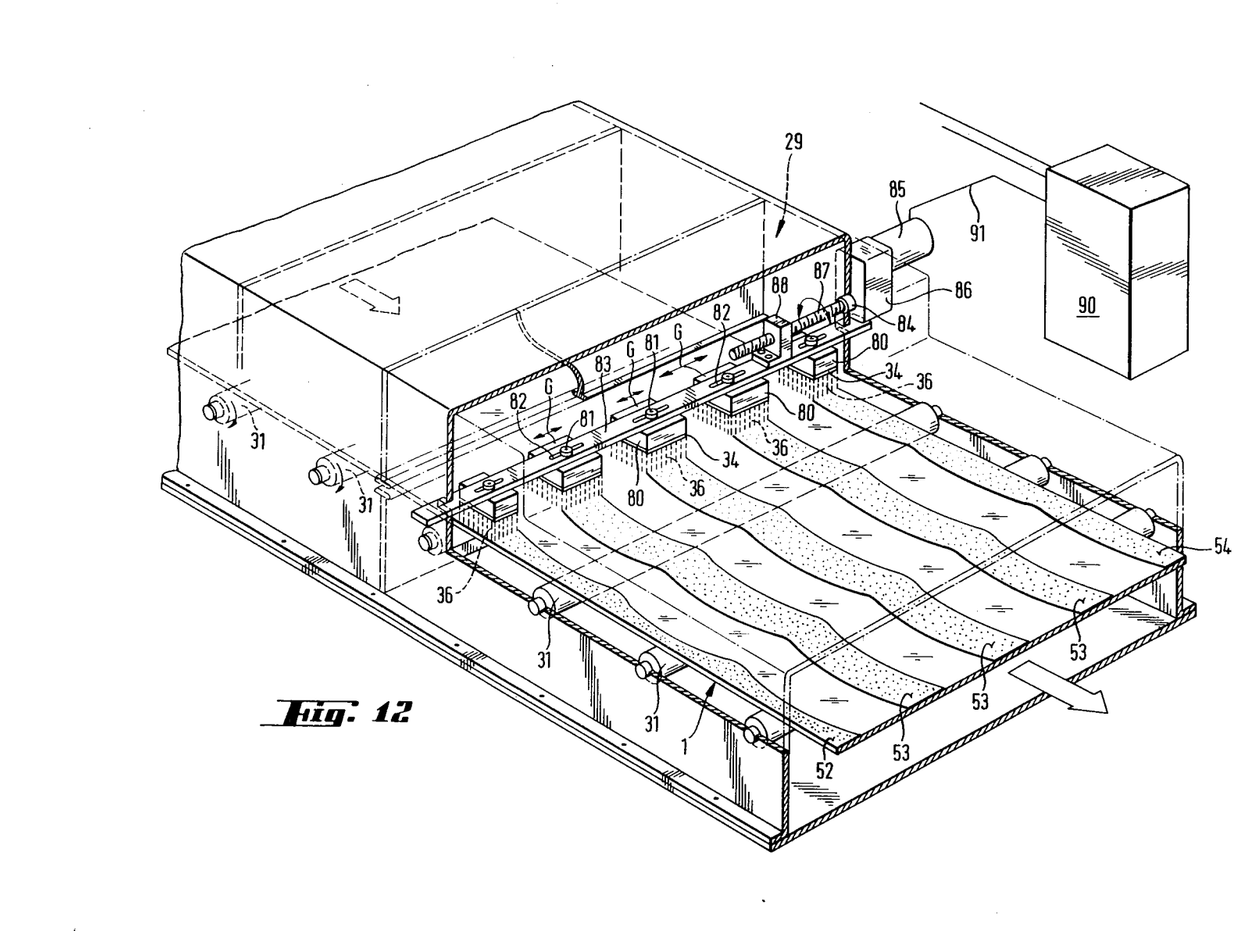
FIG. 12 is a view like those of FIGS. 7 and 9 wherein a plurality of strips coated on a glass pane are of constant width therealong.
Figure 13:
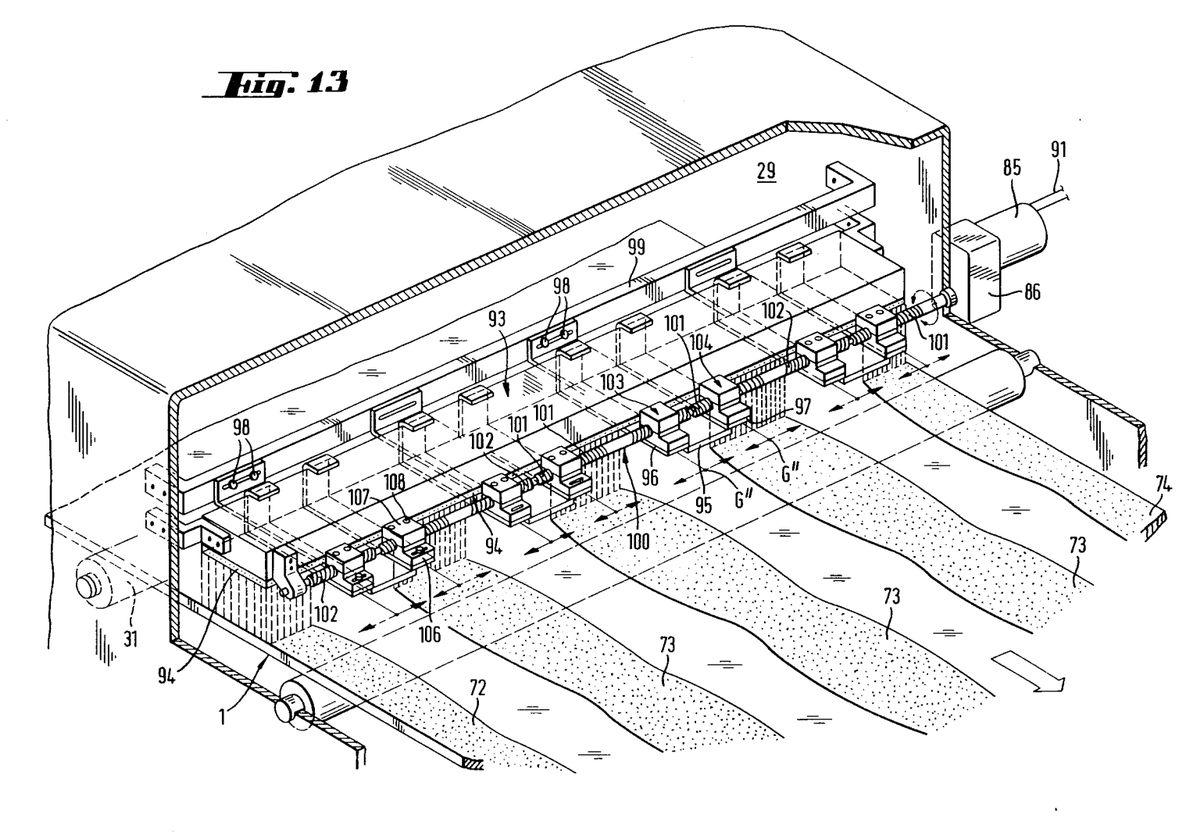
FIGS. 13 and 14 are views like those of FIGS. 7, 9 and 12 wherein a plurality of strips coated on a glass pane are of changing width therealong.
Figure 14:
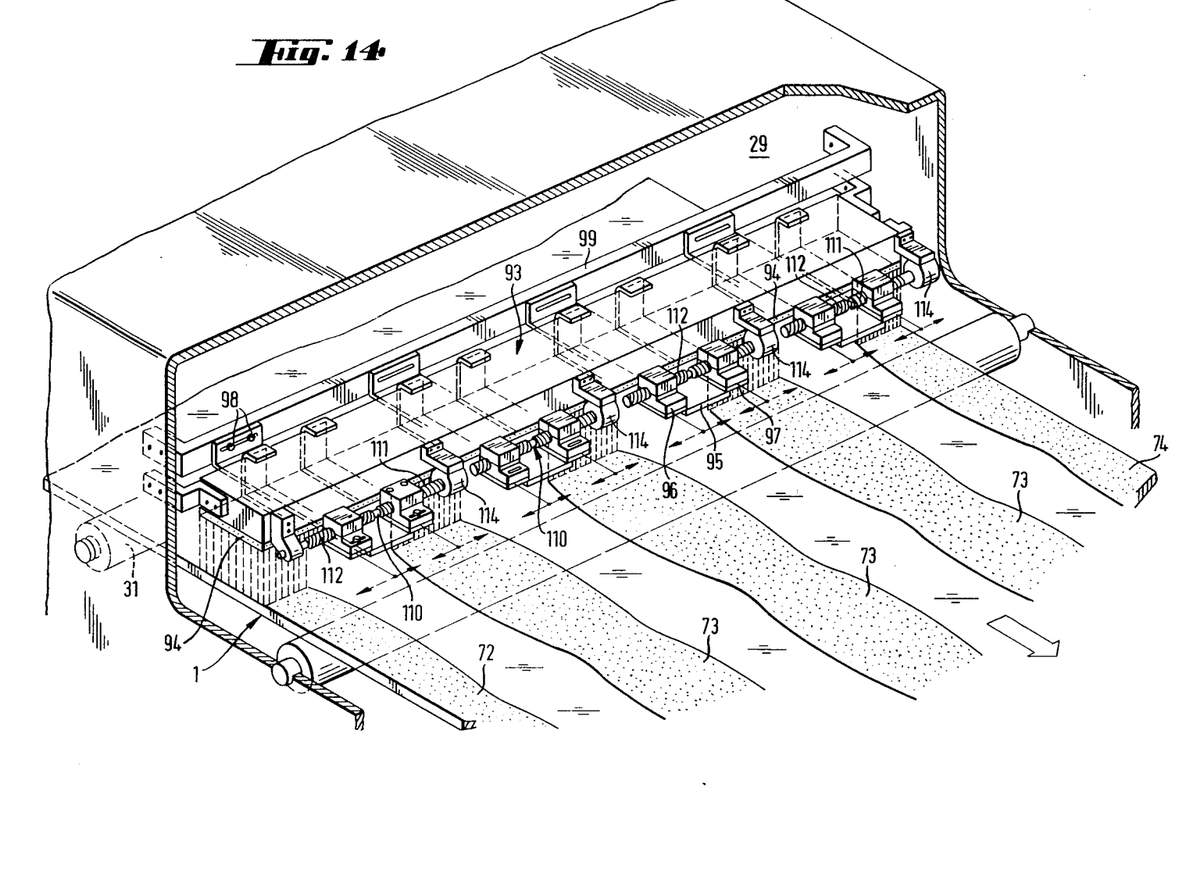

Reference now may be had to FIGS. 12-14 which illustrate the sweep-atomization apparatus for forming the filter strips of FIGS. 2-4, respectively.

Referring to FIG. 12, there is illustrated a portion of chamber 29 and glass sheet 1 which is imparted movement by rollers 31 in the direction of the arrows. Movement of the glass sheet through chamber 29 is controlled to a regulated speed as is the movement of the glass sheet through the other operative chambers (not shown in the Figure but discussed heretofore in connection with the discussion of FIG. 6).

A plurality of individual sputter cathodes 80, together with a plate 34 coextensive with the cathode and mounted to the underside of the cathode to serve as a target, are used to apply the filter strips 52, 53 and 54 to glass sheet 1. The effective width of each cathode and plate combination corresponds to the width of the filter strip to be applied. The width of each application of coating material may be controlled by the use of a shutter, such as the shutters 39, 42 and 43, arranged and operative as previously described. The application of coating material is represented by the material cloud 36 which ultimately condenses on the surface whether it is the surface of the glass sheet 1 or a coated surface, such as the metal layer 23 (see FIG. 5).

Each electrode 80 is mounted to a rail 83 in a manner whereby the electrodes are suspended below the rail. The mounting instrumentality includes a slot 82 formed in the rail and an attaching screw 81 supported by the slot for receipt by the cathode. The rail extends across chamber 29 so that the filter strips may be deposited, as heretofore discussed. A pair of friction bearings 86 (only one is shown) are supported by the chamber and, in turn, mount opposite ends of rail 83. The rail may be moved in opposite directions relative to glass sheet 1 as indicated by the arrow G. Thus, the distance between filter strips may be adjusted in accordance with pertinent requirements.

Movement of rail 83 may be an oscillatory movement controlled by a driving motor 85. A gearing 86, driving spindle 87 and a spindle nut 88, attached to rail 83, act to convert a rotational movement to the desired oscillatory movement. The amplitude of oscillation and the frequency are dependent on the desired shape of filter layers 52, 53 and 54 and the spped of movement of glass sheet 1. The parameters may be fixed in advance and stored in a program storage. The program storage may include a control unit 90 connected by line 91 to motor 85.

FIG. 13 illustrates a sputter electrode 93 and a plate 94 which extend across the full width of chamber 29 for forming filter strips, such as filter strips 72, 73 and 74, having a width which varies along their length. A shutter similar to the shutter 43 is disposed below the plate 94 thereby to occlude portions of the plate and permit coating material from the nonoccluded area of the plate to condense on a surface, whether the surface of glass sheet 1 or a coating layer, such as metal layer 23. Each shutter includes a portion 95 and a paif of portions 96, 97 located above and laterally of the portion 95. The two lateral portions 96, 97 are movable relative to the middle portion to determine the effective width of the respective filter strips along their length. This movement, in opposite directions, is indicated by arrows G".

Each middle portion 95 of a shutter is fixed to a rail 99. Paticularly, the middle portion is supported by a bracket attached to the rail by a plurality of mounting screws 98. The mounting screws extend through a slot in the bracket so that the position of the middle portion 95 of the shutter may be adjusted relative to the rail and the glass sheet 1.

A spindle 100 including a series of sections 101 having an alternating right and left handed thread mounts the lateral portions 96, 97 of each shutter. In this manner, each lateral portion of a shutter may be cntrolled to follow simultaneously a movement whereby the filter strips widen or narrow equally relative to a center line. A pair of spindle nuts 103, 104 carried by the lateral portions 96, 97, respectively, change the rotational movement of spindle 100 to the oppositely directed oscillatory movement of the lateral portions.

The position of the lateral portions 96, 97 of the shutters may be adjusted slightly. Adjustment may be accomplished by forming the spindle nut 103, 104 in two parts, including an upper part 107 and a lower part 106. The lower part of each spindle nut is attached to a lateral portion 96 (or 97 as the case may be) of the shutter and one or more machine screws 108 may be used to assemble as well as to release the parts. When the upper and lower parts are released the lateral portions 96, 97 of the shutters may be adjusted. The upper and lower path 107, 106 may, then, be reassembled.

Each of the lateral portions 96, 97 of the shutters are displaced simultaneously along the spindle 100. A drive motor 85 drives the spindle through the gearing 86. As previously indicated, the oscillation frequency and amplitude of the oscillation of the lateral portions 96, 97 of the shutters is controlled by a program stored in the control unit (see FIG. 12) over line 91. The control is provided in accordance with pertinent requirements.

The apparatus of FIG. 14 is similar to the apparatus of FIG. 13 and is capable of providing filter strips, such as filter strips 72, 73 and 74 having a variable width therealong. The form of apparatus differs from that which has been described in that each pair of lateral portions 96, 97 of each shutter are driven by individual spindles 110. Each spindle includes a length (approximately one-half the total length) having a right hand thread 111, and a length having a left hand thread 112. A separate drive motor 114 is provided for rotating each spindle according to a desired program. Since each drive motor 114 may be triggered by an independent program, the apparatus of FIG. 14 may apply a family of filter strips having variable configurations on a glass sheet 1. In this manner a variable glass pane 8 with a course of band filters deviating from one another may be produced.

We claim:

1. A process for the production of a glass pane for use in a vehicle wherein said glass pane has a band filter along at least one marginal edge, said process being characterized by providing continuous relative movement between a glass sheet and means within a chamber for depositing a coating material on said glass sheet, said glass sheet being of a size which may be subdivided into a plurality of blanks from which individual glass panes are cut, forming said deposit of coating material in a family of filter strips disposed in side-by-side relation and extending continuously in one direction along said glass sheet, and subdividing sheet whereby parts of the continuous filter strips comprise ultimately said at least one band filter along a marginal edge of said glass pane.

2. The process of claim 1 wherein each said band filter provides said glass pane with the characteristic of increased absorption and/or reflection in the visible spectral range, and wherein said family of filter strips are formed by one of a chemical (pyrolytic) process or a vacuum process including thermal evaporation and cathode atomization.

3. The process of claim 1 wherein said filter strips of said family of filter strips extend parallel to one another.

4. The process of claim 1 wherein said filter strips of said family of filter strips are of repeating curve shaped pattern having limiting lines which correspond to the contour of the marginal edge of said glass pane.

5. The process of claim 4 wherein said curve shaped pattern comprises a repeating arc-shaped pattern.

6. The process of claim 4 wherein said curve shaped pattern comprises a repeating sineshaped pattern.

7. The process of claim 5 or 6 wherein said family of filter strips includes at least four filter strips, and wherein the central filter strips have a constant width throughout their length.

8. The process of claim 4 whrein said curve shaped pattern comprises filter strips having periodic and repeating wide and narrow portions.

9. The process of claim 1, 3 or 4 wherein each filter strip of said family of filter strips intermediate outer marginal filter strips along glass sheet have a width that when said glass sheet is subdivided into said blank portions of said intermediate filter strips ultimately provide upper and lower filter bands on said glass pane.

10. The process of claim 1 further including forming directly on said glass sheet, below said family of filter strips at least one layer of material thereby to provide said glass sheet between said filter strips of said family of filter strips a highly transparent visible spectral area having correspondingly a low emission capacity and a high reflection capacity in the infrared range.

11. The process of claim 10 wherein said layer of material is electrically conductive.

12. The process of claim 11 wherein said coating material for forming said family of filter strips is an electrically conductive material having an electric conductivity greater than said layer of electrically conductive material.

13. The process of claim 9 wherein the width of said intermediate filter strips are of sufficient width that the width of the upper and lower filter bands in each glass pane are substantially equal.

14. The process of claim 1 wherein the said filter strips of said family of filter strips have a transparency which increases continuously toward said limiting line and the transition with the viewing area.

15. The process of claim 10 wherein said layer of material is selected from the group consisting of silver, aluminum, iron, chromium, copper and gold, and said layer of material is embedded between a protective layer comprising one of a metal or semiconductor compound including tin oxide, indium tin oxide, zinc sulfide, titanium oxide and titanium nitride.

16. Apparatus for use in the production of a glass pane capable of use in a vehicle wherein said glass pane has a filter strip along at least one marginal edge comprising a conveyor for conveying a glass sheet including said glass pane horizontally along a path providing therealong at least one chamber and an adjoining sluice chamber through which said glass sheet is conveyed, each of said chambers being subject to vacuum conditions, and characterized by a sputter electrode disposed in said chamber, said sputter electrode being disposed transverse to the direction of movement of said glass sheet, said sputter electrode being operative to form said filter strips of said family of filter strips on said glass sheet.

17. The apparatus of claim 16 including at least two sluice chambers along said path, one of said sluice chambers preceding said sputter chamber and one sluice chamber following said sputter chamber.

18. The apparatus of claim 16 including a plurality of sputter electrodes, means mounting said sputter electrodes, and means for adjusting said sputter electrodes relative to one another on said mounting means.

19. The apparatus of claim 18 including shutter means, said shutter means being associated with each sputter electrode, means for adjusting said shutter means to change the width of a filter strip of said family of filter strips.

20. The apparatus of claim 19 wherein said shutter means includes a bevelled limiting edge.

21. The apparatus of claim 18 including drive means, said drive means connected to each sputter electrode for periodically shifting said sputter electrodes relative to said mounting means.

22. The apparatus of claim 21 wherein said drive means includes a rail, a drive motor and a drive spindle connecting said drive motor and rail.

23. The apparatus of claim 21 wherein said drive means is controlled by a program control device according to a predetermined program.

24. The apparatus of claim 21 wherein said drive means shifts said sputter electrodes as a unit.

25. The apparatus of claim 21 wherein said drive means drives said sputter electrodes individually.

* * * * *

UNITED STATES PATENT AND TRADEMARK OFFICE
CERTIFICATE OF CORRECTION

PATENT NO. : 4,562,093

DATED : December 31, 1985

INVENTOR(S) : Mario Roth and Gunther Termath

It is certified that error appears in the above-identified patent and that said Letters Patent is hereby corrected as shown below:

In the masthead information, after "[75] Inventors" the names of the inventors should be -- Mario Roth -- and -- Gunther Termath --

Signed and Sealed this

Sixth Day of May 1986

[SEAL]

Attest:

DONALD J. QUIGG

*Attesting Officer*  *Commissioner of Patents and Trademarks*